United States Patent
Wu et al.

(10) Patent No.: US 11,870,461 B2
(45) Date of Patent: *Jan. 9, 2024

(54) FAILURE-TOLERANT ERROR CORRECTION LAYOUT FOR MEMORY SUB-SYSTEMS

(71) Applicant: MICRON TECHNOLOGY, INC., Boise, ID (US)

(72) Inventors: Wei Wu, San Diego, CA (US); Zhenlei Shen, Milpitas, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/880,144

(22) Filed: Aug. 3, 2022

(65) Prior Publication Data

US 2022/0376709 A1 Nov. 24, 2022

Related U.S. Application Data

(63) Continuation of application No. 16/205,075, filed on Nov. 29, 2018, now Pat. No. 11,438,012.

(51) Int. Cl.
*H03M 13/15* (2006.01)
*G06F 11/10* (2006.01)

(52) U.S. Cl.
CPC ..... *H03M 13/1525* (2013.01); *G06F 11/1076* (2013.01)

(58) Field of Classification Search
CPC .................. H03M 13/1525; G06F 11/1076
See application file for complete search history.

(56) References Cited

U.S. PATENT DOCUMENTS

| | | |
|---|---|---|
| 2010/0146368 A1 | 6/2010 | Chishti et al. |
| 2013/0297989 A1 | 11/2013 | Meir et al. |
| 2014/0089760 A1* | 3/2014 | Schmidt ............... G06F 11/1044 714/766 |
| 2014/0122973 A1 | 5/2014 | Motwani |
| 2014/0149825 A1 | 5/2014 | Motwani et al. |
| 2016/0149640 A1* | 5/2016 | Jovicic ................ H04L 12/2816 398/127 |
| 2018/0136857 A1 | 5/2018 | Arslan et al. |

FOREIGN PATENT DOCUMENTS

KR          1020160141557          6/2018

OTHER PUBLICATIONS

International Search Report and Written Opinion for PCT Patent Application No. PCTUS2019061838, dated Mar. 5, 2020, 10 pages.

* cited by examiner

*Primary Examiner* — April Y Blair
*Assistant Examiner* — Rong Tang
(74) *Attorney, Agent, or Firm* — Lowenstein Sandler LLP

(57) ABSTRACT

Codewords of an error correcting code can be received. The codewords can be separated into multiple segments. The segments of the codewords can be distributed in an error correcting layout across a plurality of dies where at least a portion of the error correcting (EC) layout constitutes a first layout in the form of a Latin Square.

20 Claims, 7 Drawing Sheets

| Codeword | Die₁ | Die₂ | ... | Dieₘ | Applicable shift |
|---|---|---|---|---|---|
| $C_1$ | 1 | 2 | ... | m | No right shift |
| $C_2$ | 1 | 2 | ... | m | One segment right shift |
| ⋮ | | | | | |
| $C_{(m-1)}$ | 1 | 2 | ... | m | (m-2) segment right shift |
| $C_m$ | 1 | 2 | ... | m | (m-1) segment right shift |

| Die₁ | Die₂ | ... | Die₍ₘ₋₁₎ | Dieₘ |
|---|---|---|---|---|
| 1 | 2 | ... | (m-1) | m |
| m | 1 | ... | (m-2) | (m-1) |
| ⋮ | ⋮ | ⋮ | ⋮ | ⋮ |
| 3 | 4 | ... | 1 | 2 |
| 2 | 3 | ... | m | 1 |

FAILURE-TOLERANT ERROR CORRECTION LAYOUT FOR MEMORY SUB-SYSTEMS

RELATED APPLICATIONS

This application is a continuation of U.S. patent application Ser. No. 16/205,075, filed Nov. 29, 2018, the entire contents of which is hereby incorporated by reference herein.

TECHNICAL FIELD

The present disclosure generally relates to a memory sub-system, and more specifically, relates to improved error correction layout that is more tolerant to die failure in a memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 4A illustrates an initial mapping of codeword segments across multiple dies before final mapping as a full LS ECC-XOR layout in accordance with some embodiments of the present disclosure.

FIG. 4B illustrates the final mapping of codeword segments after appropriate shift amounts are applied to the initial mapping to create the full LS layout in accordance with some embodiments of the present disclosure.

DETAILED DESCRIPTION

Figure 1:
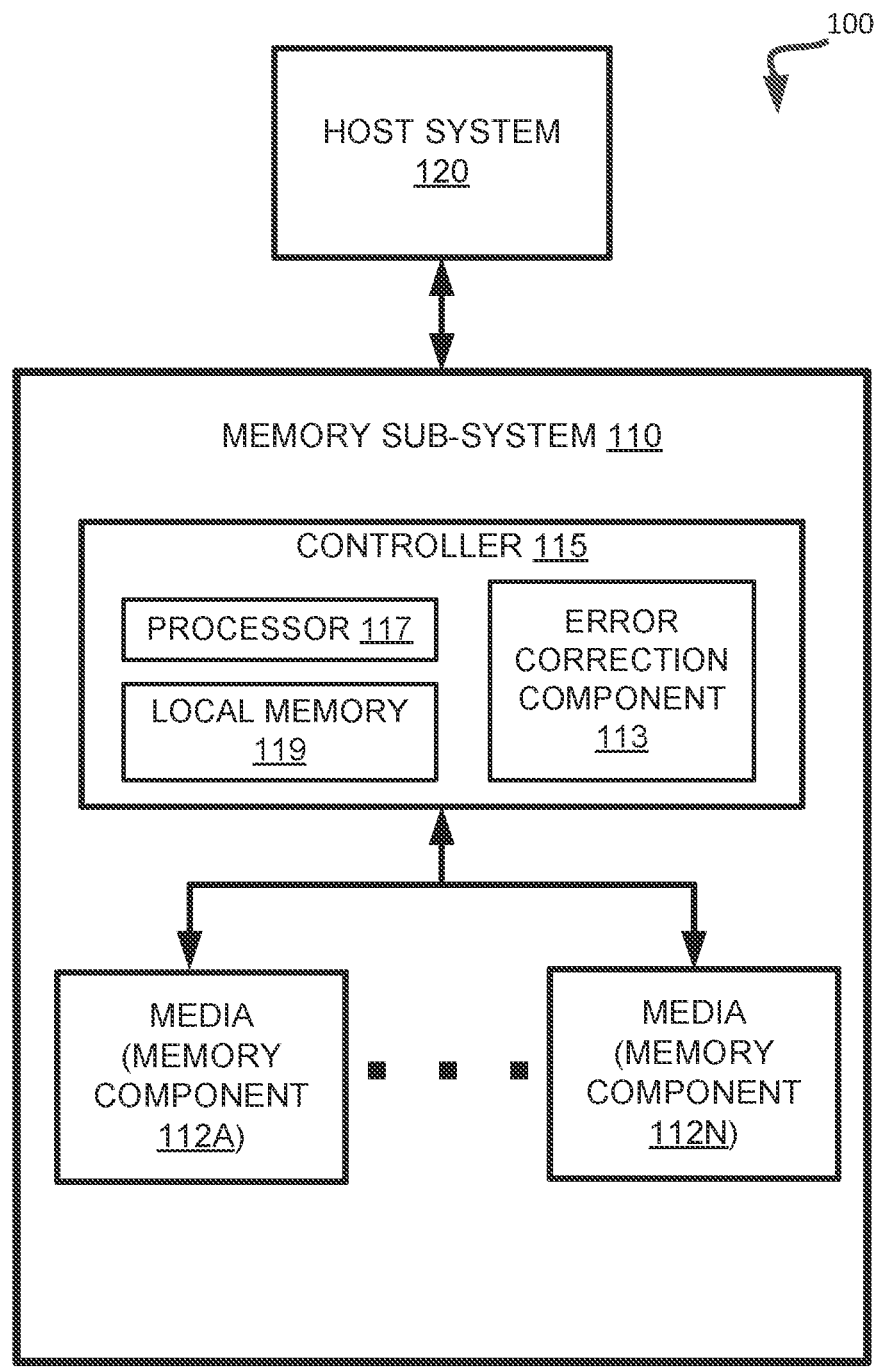
FIG. 1 illustrates an example computing environment that includes a memory sub-system in accordance with some embodiments of the present disclosure.

Aspects of the present disclosure are directed to designing an improved layout for error correcting schemes for memory sub-systems. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

ECC (Error Correcting Code) is a technique used for controlling errors in data stored in a memory sub-system. ECC involves generating parity values for error detection and correction during transmission so that correct data can be reconstructed by using a decoder without any need for retransmission. Exclusive-OR (XOR) is a Boolean logical operation that generates a parity value for a pair of bits. A codeword is an element of an ECC with a length that is equal to the length of the original data (payload) plus the length of the parity bits. If $C_1, C_2, \ldots, C_{n-1}$ are codewords for the same linear code (such as a Bose-Chaudhuri-Hocquenghem (BCH) code), then the resulting XOR value (i.e., the parity value) $C_n = C_1 \oplus C_2 \oplus \ldots \oplus C_{n-1}$ can be treated as another valid codeword that has error correcting capability.

In a conventional ECC-XOR scheme, a single codeword is assigned to a single die. Then multiple codewords from the corresponding dies are grouped together to calculate the XOR value, which is again stored in a single die. Because of storing each codeword and the XOR value in corresponding single dies, conventional ECC-XOR schemes suffer the drawback of being restricted to using codewords of shorter length, which translates to less error correction power. Conventional ECC design is limited by the worst quality die, rather than an average quality of the dies.

Aspects of the present disclosure address the above and other deficiencies by assigning a single ECC codeword to multiple dies. Each codeword is divided into multiple segments that are spread across the multiple dies. A number of codewords are grouped together to calculate an XOR value. The XOR value is also segmented. The codeword segments and the XOR segments are stored in different dies in a Latin Square (LS) layout. Generally speaking, an LS is an arrangement of letters or symbols that each occur n times, in a square array of $n^2$ compartments so that no letter or symbol appears twice in the same row or column. In the memory sub-system context, an LS layout is an arrangement of memory units where each memory unit stores one segment of a codeword which does not repeat along the same column or same row. Even if one die or a portion of that die (containing one or more memory units) fails, data can be reconstructed from decoding remaining segments of the same codeword retrieved from memory units that are intact, i.e. not physically damaged or otherwise malfunctioning.

As such, the improved ECC-XOR layout described herein is overall more capable of handling failure. Advantages of the present disclosure include, but are not limited to, ability to use longer codewords because the probability of the entire ECC-XOR scheme failing is greatly reduced. Longer codewords translates to more powerful error correction capability. The enhanced error correction capability can be harnessed because the ECC-XOR layout design is geared towards an average quality of die rather than the worst quality of die, since the limitation posed by the worst quality die can be compensated by a higher quality die to a large extent. Therefore, possible need for data recovery is much lower in the improved ECC-XOR layout. As an illustrative example, for a system having 16 dies, the conventional ECC-XOR scheme uses a 64-byte ECC codeword. The improved ECC-XOR scheme described here can construct a much longer 1024-byte codeword with 64-byte segments across the 16 available dies. ECC-XOR schemes using a 1024-byte ECC codeword has much stronger error correction power than the conventional scheme using a 64-byte codeword. The ECC codeword of the improved scheme needs to handle average error behavior from the 16 dies, as the lower quality die with higher errors can be averaged out by the higher quality die with lower errors. That is, the improved ECC-XOR layout improves the error statistics observed by the ECC code. The LS layout also enhances parallel operation at the die level because the codewords are spread out among a number of dies. Furthermore, a memory sub-system that utilizes the stronger ECC-XOR scheme can improve the error correction operations for data stored at the memory sub-system. As a result, the reliability of data stored at the memory sub-system can be improved as stronger error correction can be utilized.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a NAND type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point (XP) array (including a three-dimensional cross-point (3DXP) array) of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data. Persons skilled in the art will readily understand that the scope of the ECC-XOR scheme described in the present disclosure is not limited by the type of memory technology used.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and instead relies upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an error correction component 113 that implements an ECC-XOR code. In some embodiments, the controller 115 includes at least a portion of the error correction component 113. For example, the controller 115 can include a processor 117 (processing device) configured to execute instructions stored in local memory 119 for performing the operations described herein. In some embodiments, the error correction component 113 is part of the host system 110, an application, or an operating system. The error correction component 113 includes one or more of circuitry, dedicated logic, programmable logic, firmware, etc. to perform the operations described herein. The error-correction component 113 can generate an ECC-XOR layout. For example, a Latin Square (LS) ECC-XOR layout can be implemented as described in further detail below.

Figure 2:
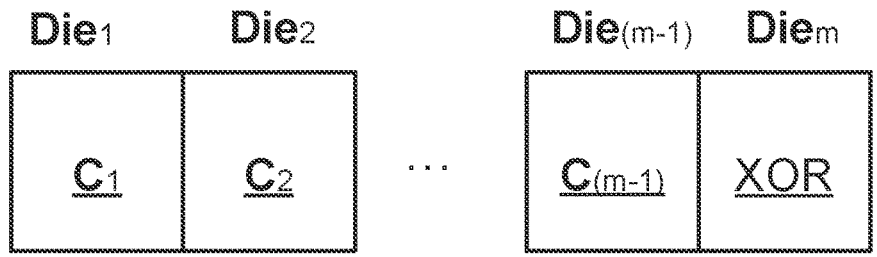
FIG. 2 illustrates a conventional layout of an ECC-XOR system.

FIG. 2 illustrates a conventional ECC-XOR layout. As described above, the codewords $C_1, C_2, C_3, \ldots, C_{m-1}$ are all elements of the same linear code (such as BCH code). Each die stores one full codeword. For example, $Die_1$ stores all the bits of codeword $C_1$, $Die_2$ stores all the bits of codeword $C_2$, and so on. Each of the codewords can be designed as $C_i=[n, k_i]$, where k is the length of the data (payload), and n is the length of the data including ECC, and i=1, 2, . . . , (m−1). All the (m−1) codewords are then grouped to perform an XOR operation, and the result of the XOR is stored in another die, $Die_m$. This scheme creates some tolerance to failure by creating and storing the XOR value (i.e. the parity bits of length n) in an additional die. However, because the design is limited by quality of the worst die, the conventional error correction scheme produces sub-optimal results. Therefore, an additional data recovery scheme is necessary to improve the error correction results.

FIGS. 3A-3B and 4A-4B illustrate the proposed Latin Square (LS) ECC-XOR layout that can support a stronger ECC scheme designed for an average quality die (rather than the worst quality die), producing optimal error correction results. The layout disclosed here tolerates single die failure by segmenting each of the codewords and storing the codewords separately in different storage units spread across multiple dies. Specifically, FIGS. 3A-3B pertain to a partial LS layout for ECC-XOR, and FIGS. 4A-4B pertain to a full LS layout for ECC-XOR. In both partial and full LS layouts, XOR is performed by grouping all the codewords, and the resulting XOR value is also segmented. The layout is called partial LS or full LS depending on whether all the XOR segments are stored in a single die or spread across all the dies. This is elaborated further below.

Figure 3A:
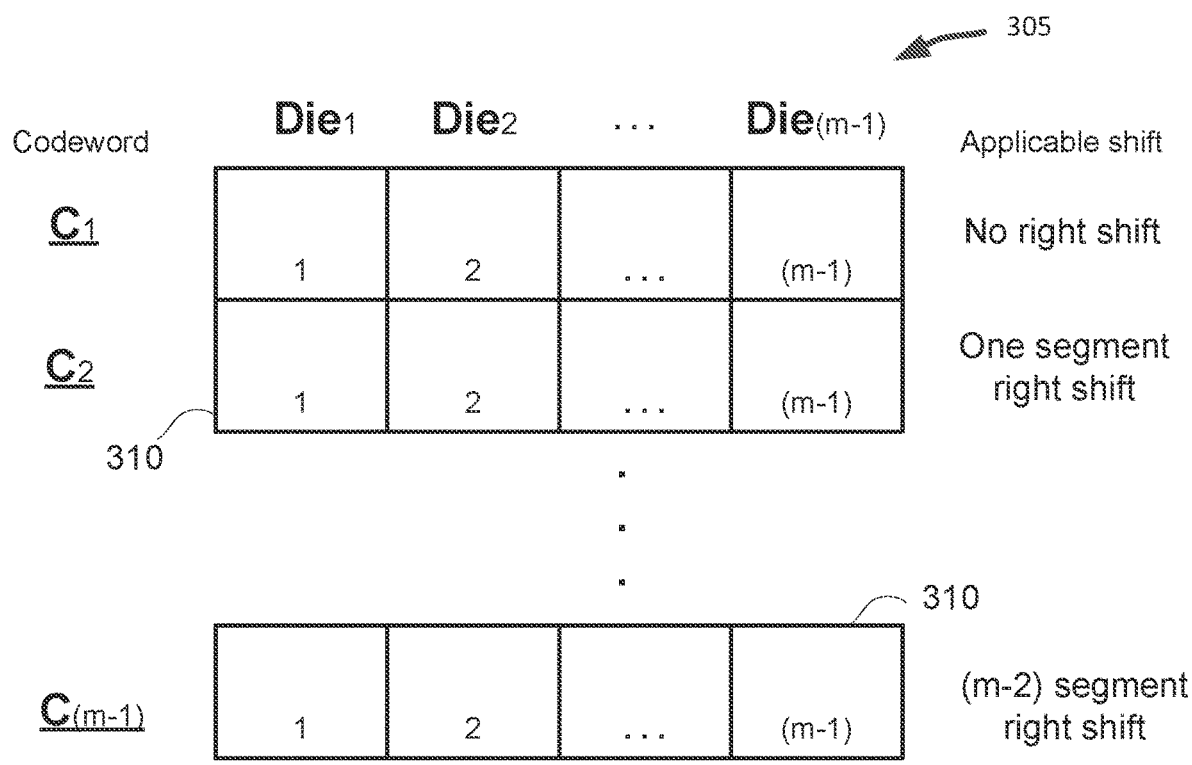
FIG. 3A illustrates an initial mapping of codeword segments across multiple dies before final mapping as a partial Latin Square (LS) ECC-XOR layout in accordance with some embodiments of the present disclosure.

Referring back to FIG. 3A, each codeword is divided into an equal number of segments and mapped initially to different storage units across multiple dies. For example, codeword $C_1$ is divided into (m−1) number of segments that are spread across (m−1) number of dies. Similarly, codeword $C_2$ is also divided into (m−1) number of segments that are spread across the same (m−1) number of dies. In general, (m−1) number of codewords segmented and spread across (m−1) number of dies creates a table 305 of dimension (m−1) times (m−1), as shown in FIG. 3A. Each cell of the table 305 indicates a physical memory unit 310 that can store multiple bits of a codeword segment. The numerical values shown within the cells of the table 305 indicate a segment index of a codeword (i.e. i-th segment of a codeword), rather than an index of the codeword itself. Initially, i-th segment of each codeword is associated with the i-th die. For example, the first segment of $C_1$, the first segment of $C_2$, all the way up to the first segment of $C_{m-1}$ are all associated with $Die_1$ along the first column of the table. Therefore, each cell in the first column shows an index 1. Similarly, the second segment of $C_1$, the second segment of $C_2$, all the way up to the second segment of $C_{m-1}$ are all associated with $Die_2$. Following the same pattern, the (m−1)-th segment of $C_1$, the (m−1)-th segment of $C_2$, all the way up to the (m−1)-th segment of $C_{m-1}$ are all associated with $Die_{(m-1)}$.

This initial mapping of codeword segment across multiple dies shown in table 305 is not in a Latin Square format though before appropriate amounts of shifts are applied. FIG. 3A lists the applicable amount of shifts (shown at the right hand side of the table 305) along each row to create the LS format of the ECC-XOR layout. The appropriate amount of shift may be equal to zero. For example, the first row of table 305 is not shifted. The second row is shifted to the right by one segment, the third row is shifted to the right by two-segments, the fourth row is shifted to the right by three segments, and so on, until the (m−1)-th row is shifted by (m−2) segments. Note that shifting segments to the left or other shifting schemes are also within the scope of this disclosure. For example, an i-th row can be shifted by (i-j) segments in either right or left direction, or in up or down direction, where j can be an arbitrary number. The result of shifting segments might not always be a LS layout, but would improve the failure-tolerance nonetheless with respect to the conventional layouts. In the embodiments where the result of shifting segments is an LS layout (either full or partial), then each codeword segment with the same segment index occurs exactly once in each column, though the ordering of the different segments along a column within a single die does not have to be consecutive. In fact, the ordering along a column within a single die can be any permutation of '(m−1)' elements for a partial LS layout and a permutation of 'm' elements in a full LS layout.

Figure 3B:
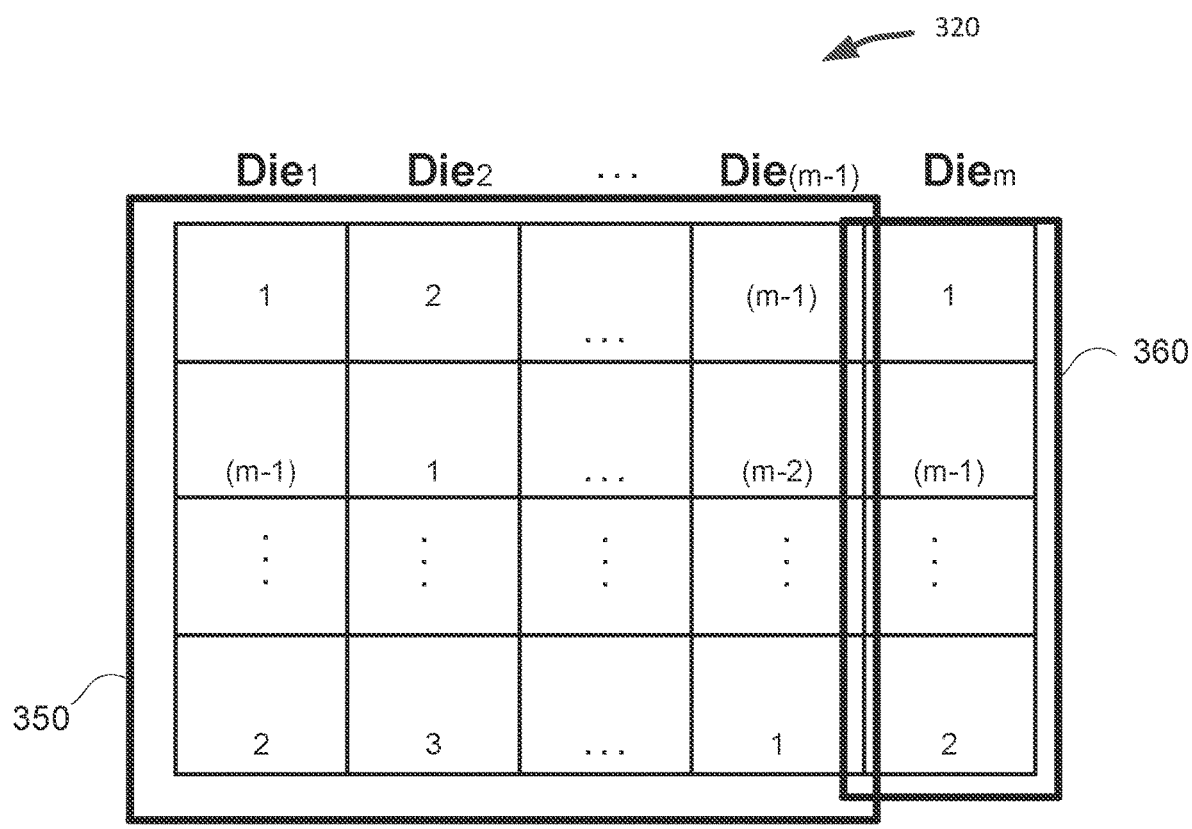
FIG. 3B illustrates the final mapping of codeword segments after appropriate shift amounts are applied to the initial mapping to create the partial LS layout in accordance with some embodiments of the present disclosure.

FIG. 3B shows the modified mapping of the codeword segments after the varying amounts of shifts are applied according to the shifting scheme shown in FIG. 3A. The entire layout 320 has two parts: a portion 350 in the format of an LS with dimension (m−1) times (m−1), and, a portion 360 outside the LS. Since the LS portion 350 does not span the entire layout 320, this layout is known as partial LS. Portion 350 of the layout 320 contains the memory units where data information is stored with the corresponding ECC codeword segments. The XOR value is calculated by grouping all the codewords, i.e., $C_m = C_1 \oplus C_2 \oplus \ldots \oplus C_{m-1}$. The XOR value $C_m$ also segmented into (m−1) segments. All the segments of the XOR value are stored in a single die ($Die_m$), albeit in different storage units along a single column in the portion 360 of the layout 320.

Within the LS portion 350 of the layout, the first row has all the segments of $C_1$, but the segments are not shifted to the right. Therefore, the first segment of $C_1$ is stored in $Die_1$, the second segment of $C_2$ is stored in $Die_2$ and so on. The second row has all the segments of $C_2$, but the segments are shifted by one die position to the right. Therefore, the first segment of $C_2$ is stored in $Die_2$, the second segment of $C_2$ is stored in $Die_3$ and so on. The third row has all the segments of $C_3$, but the segments are shifted by two die positions to the right. Therefore, the first segment of $C_3$ is stored in $Die_3$, the second segment of $C_3$ is stored in $Die_4$ and so on. In a similar fashion, the (m−1)-th row within the LS portion 350 of the layout has all the segments of $C_1$, but the segments are shifted by (m−2) die positions to the right. So, the first segment of $C_1$ is stored in $Die_1$, the second segment of $C_1$ is stored in $Die_1$ and so on.

FIG. 4A shows the initial mapping table 405 of codeword segments to create an 'm×m' LS layout. Here, the XOR value generated by grouping the first (m−1) codewords is treated as the m-th codeword. Each of the codewords, including the XOR-value codeword, is divided into m number of segments, which are stored across m number of dies. Appropriate amount of shifts are applied to this initial mapping according to a scheme shown in FIG. 4A on the right hand side of the table 405.

FIG. 4B shows the modified mapping of the codeword segments after the varying amounts of shifts are applied according to the shifting scheme shown in FIG. 4A. The entire layout 420 is in LS format (of dimension m×m). Layout 420 has two parts: a portion 450, and, a portion 460, together constituting the LS. Since the LS portion spans the entire layout 420, this layout is known as full LS. Portion 450 of the layout 420 contains the memory units where data information is stored with the corresponding ECC codeword segments. As mentioned before, the XOR value is calculated by grouping (m−1) codewords, i.e., $C_m = C_1 \oplus C_2 \oplus \ldots \oplus C_{m-1}$. $C_m$ itself is a codeword and is divided into m segments. Each segment of the XOR value is stored in a corresponding die in the portion 460 spread across the m dies.

Within the full LS layout 420, the first row has all the segments of $C_1$, but the segments are not shifted to the right. Therefore, the first segment of $C_1$ is stored in $Die_1$, the second segment of $C_2$ is stored in $Die_2$ and so on. The second row has all the segments of $C_2$, but the segments are shifted by one die position to the right. Therefore, the first segment of $C_2$ is stored in $Die_2$, the second segment of $C_2$ is stored in $Die_3$ and so on. The third row has all the segments of $C_3$, but the segments are shifted by two die positions to the right. Therefore, the first segment of $C_3$ is stored in $Die_3$, the second segment of $C_3$ is stored in $Die_4$ and so on. In a similar fashion, the (m−1)-th row within the LS layout 420 has all the segments of $C_{m-1}$, but the segments are shifted by (m−2) die positions to the right. So, the first segment of $C_{m-1}$ is stored in $Die_{m-1}$, the second segment of $C_{m-1}$ is stored in $Die_1$ and so on. And, finally, the m-th row within the LS layout 420 has all the segments of the XOR (i.e. codeword $C_m$), but the segments are shifted by (m−1) die positions to the right. So, the first segment of $C_m$ is stored in $Die_m$, the second segment of $C_m$ is stored in $Die_1$ and so on.

The arrangements shown in FIGS. 3B and 4B are just one embodiment where all segments of a single codeword are stored in the same row. This embodiment can be simple to implement, but does not limit the scope of the disclosure. Different segments of a single codeword can be stored in different rows as long as the characteristic LS property of non-repeating cells along each column and each row is preserved.

Figure 5:
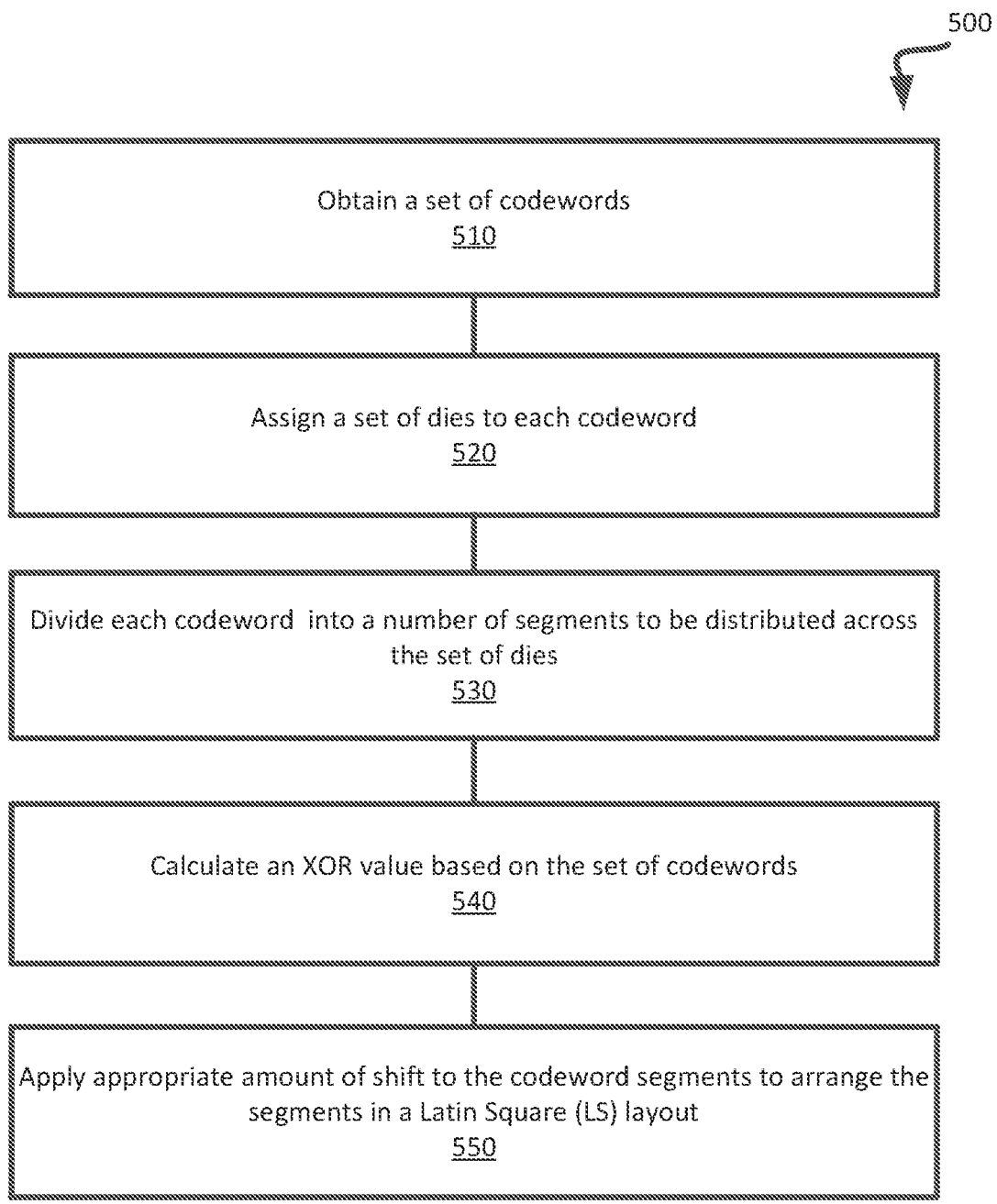
FIG. 5 is a flow diagram of an example method to create an LS layout in accordance with embodiments of the present disclosure.

FIG. 5 is a flow diagram of an example method 500 to create an ECC-XOR layout in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error correction component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic obtains a set of codewords. As described before, these codewords are elements of a linear code, such as BCH. Any number of codewords can be used. The set of codewords can be obtained when a host system provides user data to be stored at a memory sub-system. An error control operation utilized by the memory sub-system can generate the set of codewords by encoding the user data. At operation 520, the processing logic assigns a set of dies to each codeword. The total number of codewords is equal to the number of dies.

At operation 530, the processing logic divides each codeword into a number of segments. The codeword segments are to be distributed across the set of dies. If there are (m−1) number of dies assigned to each codeword, then each of the codewords are divided into (m−1) number of segments.

At operation 540, the processing logic calculates an XOR value based on the set of codewords. All the (m−1) codewords are grouped together to calculate the XOR value. The XOR value has error correction capability, and therefore, is equivalent to another codeword (i.e. the m-th codeword). The XOR value is also divided into a number of segments. The XOR value can be considered to be the parity value for the set of codewords.

At step 550, appropriate amount of shifts are applied to each of the codeword segments to arrange the codeword segments in an ECC-XOR LS layout, as described with respect to FIGS. 3A-3B and 4A-4B. For example, codeword segments can be stored across the die by applying any shifts to each of the codeword segments.

Figure 6:
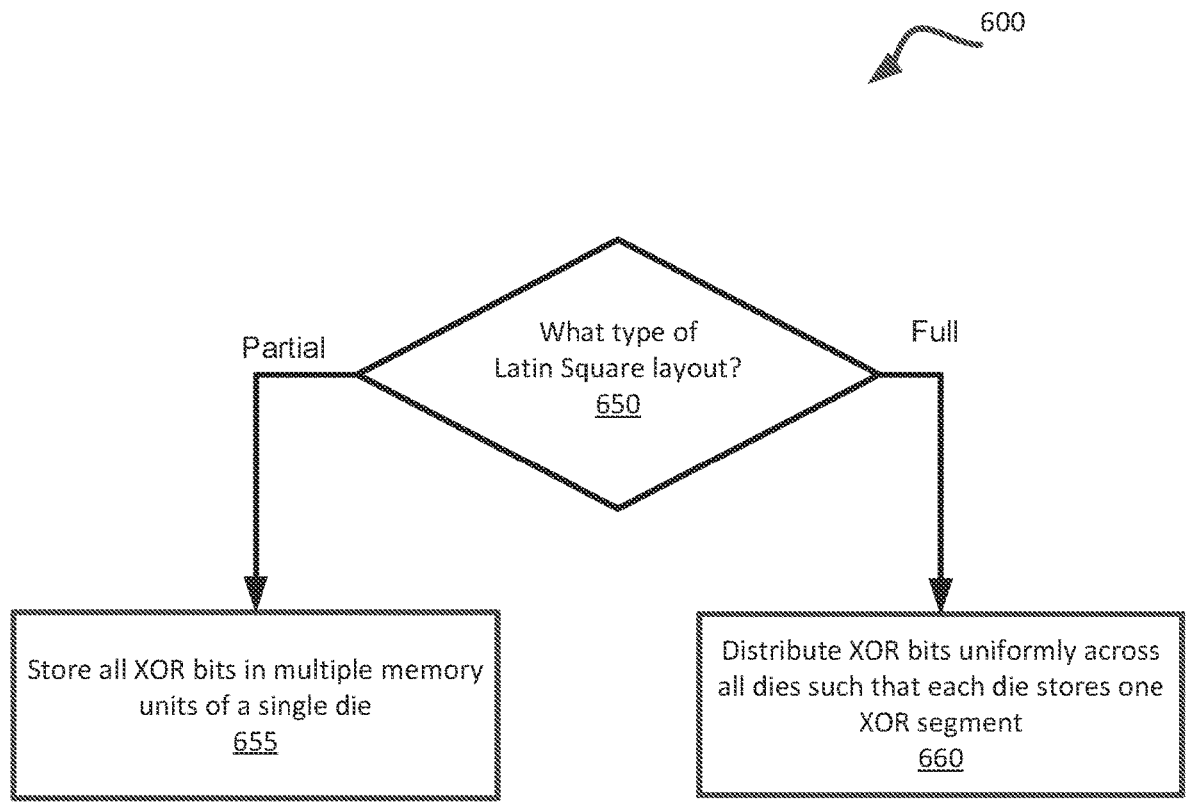
FIG. 6 is a system design flow diagram illustrating the difference between a full LS and a partial LS layout, in accordance with embodiments of the present disclosure.

FIG. 6 is a system design flow diagram illustrating the difference between a full LS and a partial LS layout, in accordance with embodiments of the present disclosure. Both the partial and the full LS layouts can handle a variety of die qualities. As shown at block 650, the memory sub-system chooses a partial or full LS based on system design parameters, such as number of channels, codeword segment size, host access capability etc.

In the case of partial LS layout, all the bits of the calculated XOR value (e.g., the value calculated in operation 540 of method 500 in FIG. 5) are stored in a single die, as described in operation 655. For example, as shown at block 655, the memory sub-system stores all XOR bits in multiple memory units of a single die. Note that though all the XOR bits are stored in a single die, that die can have multiple memory units. The die that stores the XOR bits is usually the die with the worst quality, i.e. the die with the highest probability of failure. However, in terms of potential data recovery, storing the XOR bits to the worst-quality die is more judicious than storing the codeword segments in the worst-quality die. The data bits with the ECC codewords are stored in the other available storage units in other dies arranged in the partial LS layout that are of better quality that the die storing the XOR bits.

In the case of full LS layout, the bits of the calculated XOR value (e.g., calculated in operation 540 of method 500 in FIG. 5) are distributed uniformly across all dies, such that each die stores bits of one XOR segment. For example, as shown at block 660, the memory sub-system distributes the XOR bits uniformly across all dies such that each die stores one XOR segment. Since the XOR bits are uniformly distributed across the dies, the overall failure probability due to failure of a single die gets reduced. The data bits with the ECC codewords are stored in the other available storage units in other dies.

Figure 7:
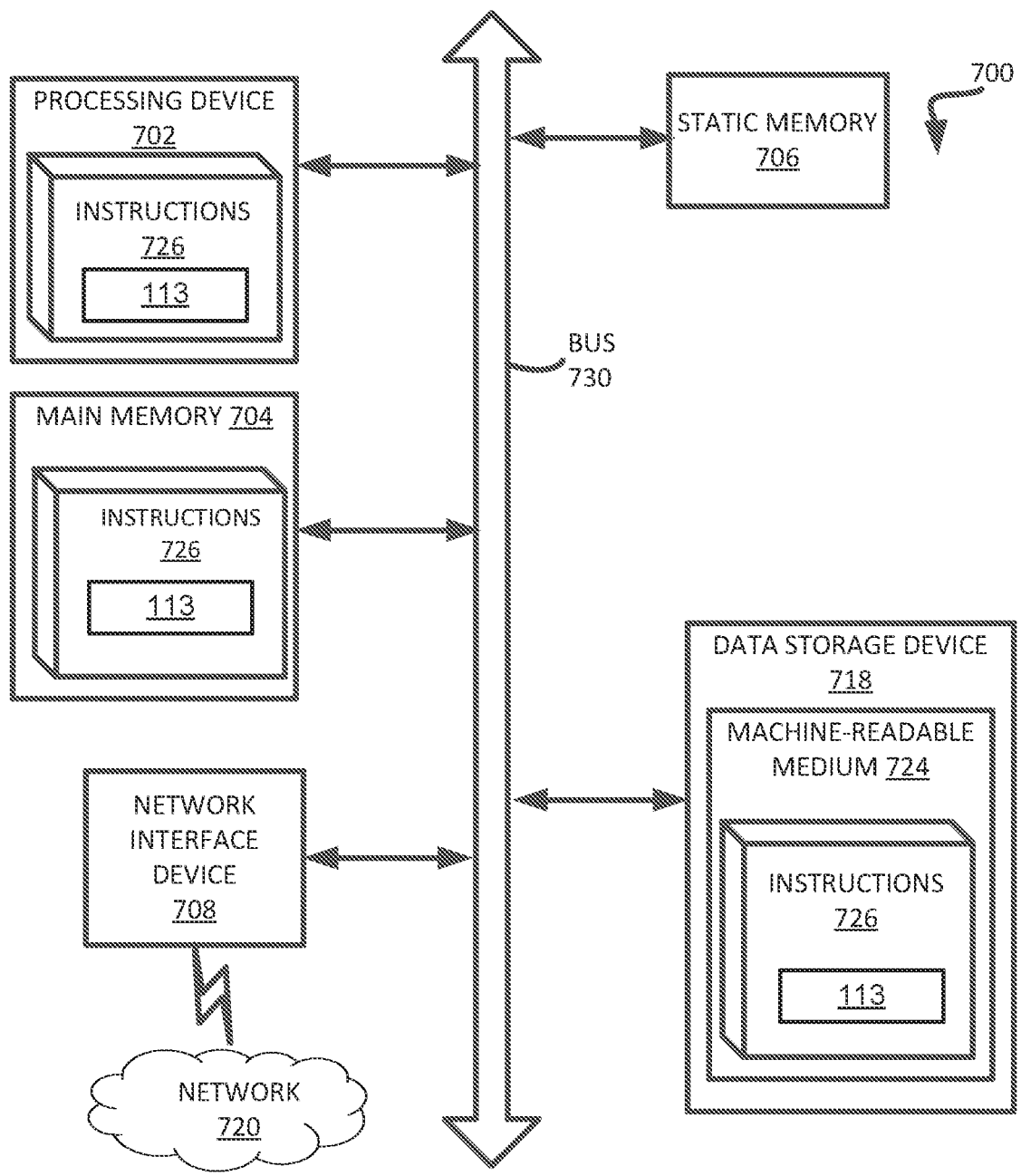
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the error correction component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a pre-read adjustment component (e.g., the error correction component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    receiving a plurality of codewords of an error correcting code for a memory sub-system;
    dividing each of the plurality of codewords of the error correcting code into a plurality of segments, wherein the plurality of segments are distributed across a plurality of dies of the memory sub-system;
    calculating an exclusive-OR (XOR) value based on a combination of the plurality of codewords;
    applying respective shifts to the plurality of segments of each of the plurality of codewords to arrange the plurality of segments into a first layout spread across the plurality of dies in the memory sub-system, wherein a number of codewords in the plurality of codewords is equal to a number of dies in the plurality of dies, and wherein a codeword segment along a column or row of the first layout is unique; and
    forming an error correcting (EC) layout across the plurality of dies, wherein the first layout constitutes at least a portion of the EC layout, wherein the EC layout stores the plurality of segments of the plurality of codewords and the calculated XOR value.

2. The method of claim 1, wherein applying respective shifts to the plurality of segments further comprises:
    applying zero shift to the plurality of segments of at least one of the plurality of codewords.

3. The method of claim 1, wherein the first layout constitutes a Latin Square (LS) layout spread across the plurality of dies.

4. The method of claim 1, further comprising:
    dividing the XOR value into a plurality of XOR value segments.

5. The method of claim 4, further comprising:
    storing the plurality of the XOR value segments in an additional die outside of the first layout and within the EC layout.

6. The method of claim 4, further comprising:
    storing the plurality of the XOR value segments across the plurality of dies within the EC layout.

7. The method of claim 4, further comprising:
    applying respective shifts to the plurality of XOR value segments.

8. The method of claim 1, wherein the number of segments in each codeword is equal to the number of dies in the plurality of dies.

9. The method of claim 8, wherein each die of the plurality of dies includes a number of memory units, and wherein the number of memory units in each die is equal to the number of segments in each codeword.

10. A method comprising:
    obtaining a plurality of codewords, wherein each codeword is an element of an error correcting code for a memory sub-system;
    assigning a plurality of dies of the memory sub-system to each codeword of the plurality of codewords, wherein a number of codewords in the plurality of codewords is equal to a number of dies in the plurality of dies;
    separating each codeword of the plurality of codewords into a plurality of segments, wherein the plurality of segments are distributed across the plurality of dies of the memory sub-system;
    calculating an exclusive-OR (XOR) value based on the plurality of codewords;
    applying respective shifts to the plurality of segments of the plurality of codewords to arrange the plurality of segments into a first layout spread across the plurality of dies of the memory sub-system, wherein a codeword segment along a column or row of the first layout is unique; and
    storing the plurality of segments of the plurality of codewords and the calculated XOR value in an error correcting (EC) layout across the plurality of dies, wherein the first layout constitutes at least a portion of the EC layout.

11. The method of claim 10, wherein the first layout constitutes a Latin Square (LS) layout spread across the plurality of dies.

12. The method of claim 11, wherein a number of memory units in each die of the plurality of dies is equal to the number of segments in each codeword.

13. The method of claim 12, wherein each memory unit along a column of the EC layout corresponds to one die of the plurality of dies, and each memory unit along a row of the EC layout corresponds to a different die of the plurality of dies.

14. The method of claim 13, further comprising:
dividing the XOR value into a plurality of XOR value segments; and
storing each of the XOR value segments in an additional die within the EC layout other than the plurality of dies associated with the first layout.

15. The method of claim 14, wherein the EC layout in its entirety constitutes a Latin Square layout.

16. A system comprising:
a plurality of memory dies; and
a processing device, operatively coupled with the plurality of memory dies, to perform operations comprising:
receiving a plurality of codewords of an error correcting code;
dividing each of the plurality of codewords of the error correcting code into a plurality of segments, wherein the plurality of segments are distributed across the plurality of memory dies;
calculating an exclusive-OR (XOR) value based on a combination of the plurality of codewords;
applying respective shifts to the plurality of segments of each of the plurality of codewords to arrange the plurality of segments into a first layout spread across a plurality of dies, wherein a number of codewords in the plurality of codewords is equal to a number of dies in the plurality of dies, and wherein a codeword segment along a column or row of the first layout is unique; and
forming an error correcting (EC) layout across the plurality of dies, wherein the first layout constitutes at least a portion of the EC layout, wherein the EC layout stores the plurality of segments of the plurality of codewords and the calculated XOR value.

17. The system of claim 16, wherein, while applying respective shifts to the plurality of segments, the processing device is to perform operations further comprising:
applying zero shift to the plurality of segments of at least one of the plurality of codewords.

18. The system of claim 16, wherein the first layout constitutes a Latin Square (LS) layout spread across the plurality of dies.

19. The system of claim 16, wherein the processing device is to perform operations further comprising:
dividing the XOR value into a plurality of XOR value segments.

20. The system of claim 19, wherein the processing device is to perform operations further comprising:
causing the plurality of the XOR value segments to be stored in an additional die outside of the first layout and within the EC layout; or
causing the plurality of the XOR value segments to be stored across the plurality of dies within the EC layout.

* * * * *